United States Patent [19]

Kagayama et al.

[11] Patent Number: 5,038,710
[45] Date of Patent: Aug. 13, 1991

[54] DEVELOPER MATERIAL COATING APPARATUS

[75] Inventors: Shigeru Kagayama, Nagoya; Tetsuya Kitamura, Gifu, both of Japan

[73] Assignee: Brother Kogyo Kabushiki Kaisha, Japan

[21] Appl. No.: 437,516

[22] Filed: Nov. 16, 1989

[30] Foreign Application Priority Data

Nov. 18, 1988 [JP] Japan .................. 63-293070
Nov. 18, 1988 [JP] Japan .................. 63-293071

[51] Int. Cl.⁵ ........................................ G03G 15/08
[52] U.S. Cl. .................... 118/653; 118/641; 355/279; 355/259
[58] Field of Search ............ 118/653, 655, 641, 643, 118/642, 630; 355/277, 278, 279, 215, 259

[56] References Cited

U.S. PATENT DOCUMENTS

| | | | |
|---|---|---|---|
| 3,667,422 | 6/1972 | Saladin | 118/641 |
| 3,667,742 | 6/1972 | Kamola | 355/266 |
| 3,685,896 | 8/1972 | Kaup | 355/279 |
| 4,047,182 | 9/1977 | Faren | 343/904 |
| 4,073,583 | 2/1978 | Teumer et al. | 355/279 |
| 4,095,886 | 6/1978 | Koeleman et al. | 355/290 |
| 4,104,416 | 8/1978 | Parthasarathy et al. | 427/29 |
| 4,232,628 | 11/1980 | Shelffo | 118/653 |
| 4,242,566 | 12/1980 | Scribner | 118/641 |
| 4,369,729 | 1/1983 | Shigenobu et al. | 355/266 |
| 4,541,705 | 9/1985 | Knechtel | 355/285 |
| 4,563,086 | 1/1986 | Knapp et al. | 355/228 |
| 4,647,182 | 3/1987 | Pierce | 355/326 |
| 4,696,561 | 9/1987 | Katoh | 355/295 |
| 4,801,949 | 1/1989 | Misono et al. | 355/100 |
| 4,841,338 | 6/1989 | Suzuki | 355/27 |

FOREIGN PATENT DOCUMENTS

| | | |
|---|---|---|
| 2577472 | 8/1986 | France . |
| 1169410 | 11/1969 | United Kingdom . |
| 1350946 | 4/1974 | United Kingdom . |
| 1378798 | 12/1974 | United Kingdom . |
| 1527168 | 10/1978 | United Kingdom . |
| 2055619 | 3/1981 | United Kingdom . |
| 2172123 | 9/1986 | United Kingdom . |
| 2172711 | 9/1986 | United Kingdom . |
| 2201803 | 9/1988 | United Kingdom . |

OTHER PUBLICATIONS

"Electrophotographic Processes and Systems", published 1977 by Van Nostrand, p. 369.

Primary Examiner—Richard Bueker
Assistant Examiner—George A. Groudreau
Attorney, Agent, or Firm—Oliff & Berridge

[57] ABSTRACT

A developer material coating apparatus for coating a developer toner on a support member such as a plain paper to form an image on the support member, includes a developer toner coating unit for triboelectrically charging the developer toner and electrostatically coating the charged developer toner on the support member and at least one of heaters for heating the support member before and/or after the support member being coated with the charged developer toner, thereby to heighten adhesion between the support member and the developer toner.

12 Claims, 2 Drawing Sheets

DEVELOPER MATERIAL COATING APPARATUS

BACKGROUND OF THE INVENTION

This invention relates to a developer material coating apparatus for coating a developer material on a support member such as a plain paper or the like to form an image forming medium.

In a conventional image forming apparatus, a particular paper produced in a . paper manufacturing company has been necessarily used as an image forming medium for forming an image thereon. Accordingly, in the conventional image forming apparatus, it has been impossible for an user to form the image on a support member such as a plain paper which is freely selected by the user, and further it has been impossible for the user to coat a developer material on the support member to form an image forming medium.

In view of the above disadvantage of the conventional image forming apparatus, there has been proposed an image forming apparatus in which microcapsules encapsulating dye precursor and having a mechanical strength variable in accordance with intensity of light irradiated thereto. This image forming apparatus is described in the co-pending U.S. Pat. Application No. 253,614 filed on Oct. 5, 1988 which has been commonly assigned to the assignee of this application. In this image forming apparatus, a microcapsule sheet on which the microcapsules are carried and to which light has been irradiated in accordance with an image information is closely contacted with an image forming medium which is formed by coating the surface of a support member such as a plain paper or the like with a developer material, the support member being freely selected by the user, and then the contacted microcapsule sheet and the support member are subjected to a pressure-development. In the pressure development process, those microcapsules which have a low mechanical intensity are ruptured and then the dye precursor issued from the ruptured microcapsules is reacted with the developer material coated on the support member, so that an image is formed on the support member. In the coating process for coating the developer material on the support member, the developer material is positively charged with contact or friction of the developer material with a developing sleeve or other members in a charging unit, and an electrode which is applied with a voltage having the opposite polarity to the developer material (for example, a voltage having a negative polarity) is disposed at the rear surface side of the support member. An electric field portion for electrically attracting the charged developer material to the support member is formed between the charging unit and the electrode. Accordingly, the charged developer material is electrically attached to the whole front surface of the support member and is coated thereon.

In the image forming apparatus thus constructed, the charged developer material is firmly attached to the front surface of the support member when it is electrically attached thereto (that is , the developer material is disposed in the electric field portion and an electrostatic force is applied to the charged developer material by the electrode). However, the charged material is injected with charges from the support member and an attaching force of the developer material to the support member is reduced immediately when it is fed out of the electric field portion. Further, the support member absorbs moisture in a highly-moist atmosphere and an insulating property of the support member is degraded, so that a transfer coefficient (a coefficient of transferring and adsorbing the developer material to the support member) is lowered.

The lowering of the attaching capability (force) of the developer material to the support member causes the conventional image forming apparatus to suffer from the following disadvantages. The developer material on the support member is liable to be detached from the support member when fed out of the electric field portion. Further, in the pressure-developing process in which the microcapsule sheet and the support member having the developer material thereon are closely contacted with each other under pressure, the developer material is liable to be attached to the microcapsule sheet with no chromogenic reaction As a result, no image is formed on the support member, or an image is not wholly formed on the image member(that is, a part (some pixels) of the image is not formed on the support member.

SUMMARY OF THE INVENTION

An object of this invention is to provide a developer material coating apparatus in which adhesion between a developer material and a support member is heightened to allow the developer material to firmly and stably adhere to the support member in a feeding process between an adhesion process and a pressure-development process, and adhesion of the developer material to a microcapsule sheet is prevented in the pressure-development process.

The above object is attained by provision of a developer material coating apparatus according to this invention, comprising developer toner coating means for triboelectrically charging the developer toner and electrostatically coating the charged developer toner on the support member and heating means for heating the support member before and/or after coated with the charged developer toner, thereby to heighten adhesion between the support member and the developer toner. The heating means comprises a heating unit for heating the support member coated with the developer toner and melting a part of the developer toner to thereby heighten adhesiveness of the developer toner to the support member, or at least one of heaters for heating and drying the support member to vaporize water contained in the support member and prevent degradation of insulating property of the support member.

DETAILED DESCRIPTION OF THE INVENTION

The preferred embodiments of this invention will be described hereunder with reference to the accompanying drawings.

Figure 1:
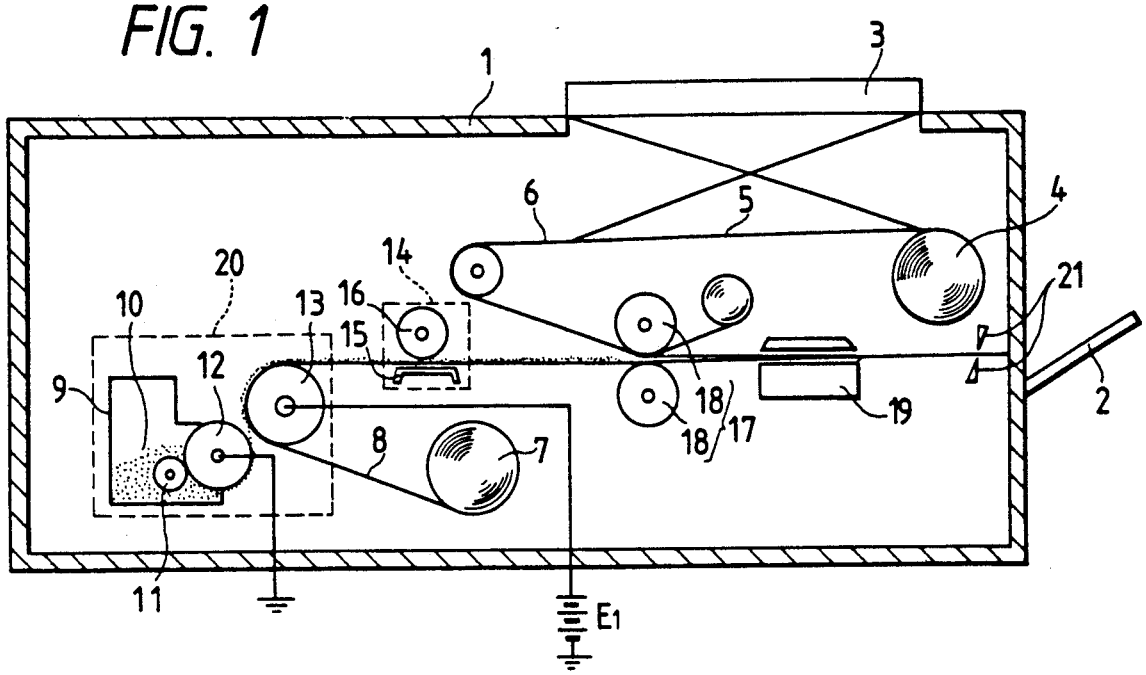
FIG. 1 is a cross sectional view of a copying machine containing an embodiment of the developer material coating apparatus according to this invention.

FIG. 1 is a cross sectional view of a copying machine in which a developer material coating apparatus according to this invention is mounted.

The copying machine includes a housing 1, an original mount 3 provided at a top portion of the housing 1 for placing an original thereon and a sheet discharging member 2 provided at a side portion of the housing 1 for discharging a support member 8 such as a plain paper or the like. The housing 1 includes a sheet roller 4 for winding and accommodating a longitudinal microcapsule sheet 6 on which microcapsules encapsulating dye precursor and having a mechanical intensity variable in accordance with intensity of an irradiated light thereto are carried, a support roller 7 for winding and accommodating a longitudinal support member 8 such as a plain paper or the like, an exposure unit 5 disposed at the downstream of the sheet roller 4 for applying light to the microcapsule sheet 6 which is fed from the roller 4 to the exposure unit 5, a developer material coating unit 20 for triboelectrically charging a developer toner including the developer material in the same polarity thereto (positive polarity) and electrically coating the charged developer toner 10 on the surface of the support member fed out of the roller 7, a pressure-development unit 17 comprising a pair of pressure-developing rollers 18 for superposing the exposed microcapsule sheet and the support member coated with the developer material and closely contacting them under pressure to form an image on the support member, a heat-fixing unit 19 for heat-fixing the developed image on the support member, and a cutter 21 for cutting the heat-fixed support member at a predetermined length and discharging it to the discharging member 2. The housing 1 further includes a heat unit 14 comprising a heater 15 disposed in such a manner as to be contacted with the rear surface of the support member 8 and an auxiliary roller 16 disposed above the support member so as to confront the front surface (the surface coated with the developer toner) of the support member 8. The heat unit 14 heats the support member 8 coated with the developer toner 10 to melt a part of the developer toner 10 coated on the support member 8.

The developer material coating unit 20 includes a toner case 9 for accommodating the developer toner, a coating roller 12 for coating the developer toner 10 on the support member, a supply roller 11 disposed below the toner case 9 and contacted with the coating roller 12 at the periphery thereof for supplying the coating roller 12 with developer toner accommodated in the toner case 9, and a counter roller 13 disposed at the opposite position to the coating roller 12 with respect to the support member 8. The counter roller 13 is connected to a D.C. power source $E_1$ so as to be applied to a voltage having the opposite polarity to the charged developer toner 10 (that is, a negative voltage), so that the developer toner 10 on the coating roller 12 electrostatically adheres to the support member 8 through an electrical field which is applied between the coating roller 12 and the counter roller 13.

The developer toner 10 is produced by mixing the developer material with thermoplastic material and finely granulating the mixed materials to form fine particles thereof. The thermoplastic resin is, for example, a resin which comprises 80 wt% of a copolymer of styrene and n-butyl methacrylate and 15 wt% of a copolymer of ethylene and vinyl acetate. The developer toner 10 including the above resin is melted approximately at 120° C.

The operation of the copying machine thus constructed will be described below.

The support member 8 is fed from the support roller 7 to the developer material coating unit 20 in accordance with the rotation of the support roller 7. In the developer material coating unit 20, the developer toner 10 is triboelectrically charged in the toner case 9 so that it is provided with positive charges. Thereafter, a suitable amount of the charged developer toner 10 is fed through the supply roller 11 to the coating roller 12. Since the counter roller 13 is applied to a negative voltage, the positively-charged developer toner 10 is electrostatically attracted toward the counter roller 13 and is attached to the support member 8 which is wound around the counter roller 13. That is, the support member 8 is passed through the developer material coating unit 20 while the developer toner 10 is electrostatically attached to the whole surface of the support member 8.

The support member passed through the developer material coating unit 20 is fed to the heat unit 14. The support member 8 is heated by the heater 15 from the rear surface of the support member on which no developer toner is coated, for example, to the extent that a part of the developer toner which is positioned in the neighboring of the front surface of the support member 8 is melted. This melting of the part of the developer toner on the surface of the support member 8 enables the whole developer toner to firmly adhere to the support member 8. In this case, a clogging of the support member is liable to occur due to the melting of the thermoplastic material and the coloring of the image is deteriorated. Accordingly, it is necessary to provide a controller (not shown) for accurately controlling the heater 15 or the auxiliary roller 16 for heightening thermal stability of the upper portion (surface) of a layer of the developer toner coated on the support member 8.

The support member 8 to which the developer toner 10 has been firmly attached is fed to the pressure-development unit 17, and is superposed over the microcapsule sheet which has been exposed to light, thereby performing the pressure-development.

As described above, the developer toner 10 is firmly attached to the support member 8, so that the developer toner 10 is completely prevented from falling off the surface of the support member 8 during the feeding of the support member 8 to the pressure-development unit 17 and from being exfoliated from the support member 8. Accordingly, an excellent image having no omitted pixels, that is, an image which completely corresponds to an original image can be formed on the support member 8.

After the pressure-development process, the support member 8 is subjected to the heat fixing process in the heat fixing unit 19. The heat-fixed support member 8 is cut off at a predetermined length by the cutter 21 and discharged to the discharging member 2.

Any modification may be made to the embodiment as described above insofar as the modification is not departed from the subject matter of this invention. For example, in place of the heater 15, the support member may be heated with a hot air or radiation. The former is performed by a fan heater and the latter is performed by an infrared lamp.

In the above embodiment, the heating unit 14 is used to melt a part of the developer toner coated on the support member 8 so that the developer toner is firmly attached to the support member 8. That is, the heating unit 14 is used to heighten the adhesiveness of the developer toner 10 to the support member 8 by heating the developer toner 10 itself. However, the adhesiveness of the developer toner 10 to the support member 8 is also heightened by heating the support member 8 itself particularly at a highly-moist atmosphere. In general, the support member 8 is liable to absorb moisture at the highly-moist atmosphere and the insulating property thereof is degraded. The degradation of the insulating property of the support member causes the decrease of the transfer coefficient and promotes charge injection through the support member to the developer toner, so that the developer toner is liable to fall off the support member. However, the above disadvantage of the conventional developer material coating apparatus is also overcome by this invention.

Figure 2:
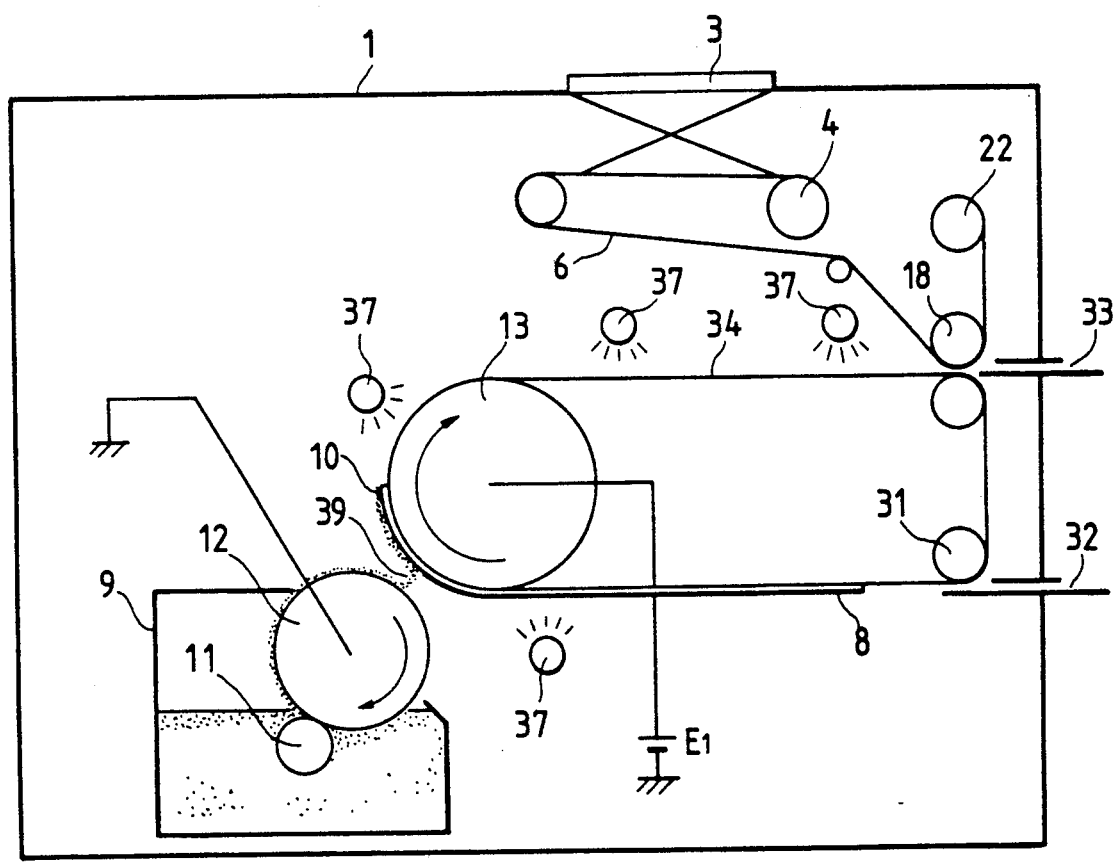
FIG. 2 is a cross sectional view of a copying machine containing another embodiment of the developer material coating apparatus according to this invention.

FIG. 2 is a cross sectional view of a copying machine containing another embodiment of the developer material coating apparatus according to this invention. The same elements as those in FIG. 1 are designated by the same reference numerals. In the copying machine as shown in FIG. 1, the support member 8 is beforehand provided as a support roll in the copying machine. On the other hand, in the copying machine as shown in FIG. 2, the support member 8 is manually or automatically provided from an inlet 12 to the body of the copying machine. However, this difference does not pertain to the subject matter of this invention. The provision of the support member to the body of the copying machine may be carried out in any manner.

The housing 1 has an inlet 32 for inserting the support member 8 therethrough and an outlet 33 for discharging the support member 8 therethrough, the inlet 32 and the outlet 33 being provided at the side portion of the housing 1. The counter roller 13 and another auxiliary roller 31 are freely rotatably mounted in the housing 1, and a carrying belt 34 such as an endless belt for carrying the support member thereon in a feeding passage, which is defined from the inlet 32 through the developer material coating region to the outlet 33, is suspended between the counter roller 13 and the auxiliary roller 31.

The support member 8 inserted through the inlet 32 is fed through a developer material coating region 39 to the outlet 33 in accordance with movement of the carrying belt 34. On the other hand, the microcapsule sheet 6 which has been wound around the sheet roller 4 is fed to a gap between the pair of the pressure-developing rollers 18 so as to be closely contacted with the support member 8 having the developer toner 10 thereon under pressure, and then is took up by a winding roller 22.

Unlike the copying machine as shown in FIG. 1, in the copying machine as shown in FIG. 2 plural infrared heaters 37 for heating and drying the support member 8 are disposed at the upstream and downstream sides of the developer material coating region 39 such that they are arranged along the feeding passage of the support member 8 and adjoin the feeding passage.

The heat-fixing unit 19 and the cutter 21 as shown in FIG. 1 are eliminated from FIG. 2 because those elements do not pertain to the subject matter of this invention. Further, when the support member 8 which is beforehand cut at a predetermined length is inserted through the inlet 32, the cutter 21 is not necessary.

As described above, the support member 8 is liable to absorb moisture at the highly-moist atmosphere and the insulating property thereof is degraded. The degradation of the insulating property of the support member causes the transfer coefficient to be lowered and promotes charge injection through the support member to the developer toner. Accordingly, the adhesiveness of the developer toner 10 to the support member 8 is rapidly lowered after the support member 8 is passed through the developer material coating region 39. However, the support member 8 is heated and dried by the infrared heaters 37 over the feeding passage of the support member 8, so that the above disadvantage can be prevented.

Figure 3:
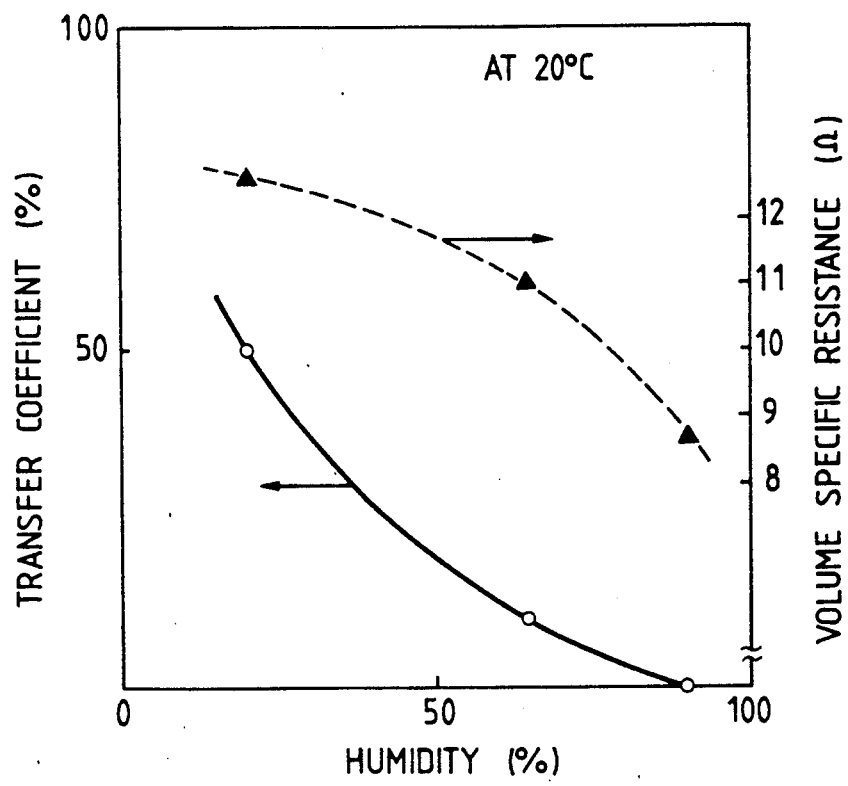
FIG. 3 is a graph for showing the relation of a transfer coefficient and a volume specific resistance of a plain paper(support member) with humidity at a temperature of 20° C.

FIG. 3 is a graph for showing the relation of a transfer coefficient and a volume specific resistance of a plain paper(support member) with humidity at a temperature of 20° C.

As is apparent from FIG. 3, the volume specific resistance of the plain paper is below $1 \times 10^{11}$ $\Omega$ at the humidity above 65% and the transfer coefficient is below 10%. Accordingly, in this condition, the developer toner 10 is not sufficiently attached to the support member 8. However, when the plain paper (support member 8) is heated to increase the temperature thereof approximately up to 100° C. by the infrared heaters before transferring the developer toner 10 to the support member 8, water absorbed by the plain paper is rapidly vaporized and the volume specific resistance of the plain paper is gradually increased. For example, the volume specific resistance of the plain paper is increased up to $5 \times 10^{12}$ $\Omega$ in the initial stage of the transferring operation of the developer toner 10 to the support member 8 and the transfer coefficient is increased up to 50%, so that the developer toner 10 is sufficiently firmly attached to the support member. Further, since the support member 8 coated with the developer toner 10 is further heated and dried by the infrared heaters, the insulating property of the support member remains unchanged (that is, the support member 8 constantly keeps a high insulating property over the copying process). Accordingly, the charge injection from the support member 8 to the developer toner 10 is sufficiently prevented, so that the developer toner 10 is constantly electrostatically attached to the support member 8. This prevents the developer toner 10 from falling off the support member 8.

The feeding process of the support member, the coating process of the developer toner 10 to the support member 8 and the other processes in the copying machine as shown in FIG. 2 are similar to those of the copying machine as shown in FIG. 1, and therefore the detailed description thereof is eliminated.

The developer toner 10 stocked in the toner case 9 is triboelectrically charged in accordance with the rotation of the coating roller 12 and the auxiliary roller 11 which is contacted with the coating roller 12 at the periphery thereof, and the homogeneously charged developer toner 10 is attached to the peripheral surface of the coating roller 12. The support member 8 inserted through the inlet 32 is carried on the carrying belt 34 and is fed to the developer material coating region 39 while heated and dried by one or more infrared heaters 37. The support member 8 which has been electrostatically coated with the developer toner 10 in the developer material coating region 39, after passed through the developer material coating region 39, is further heated and dried by another heater or other heaters 37 and then is fed to the pressure-developing rollers 18 to be closely contacted with the microcapsule sheet 6 under pressure and subjected to the pressure development. The developer toner 10 is also firmly attached to the support member 8 in this embodiment. Accordingly, like the first embodiment, the developer toner 10 does not fall off the support member 8 in the feeding process and does not exfoliate from the support member 8 in the pressure development process, so that an excellent image having no omitted pixels, that is, an image which completely corresponds to an original image can be formed on the support member 8. After the pressure development process, the developed support member 8 is discharged from the outlet 13.

In this embodiment, the infrared heaters are used to heat and dry the support member to prevent degradation of the insulating property of the support member itself. However, like the first embodiment, at least one of the heaters may be used to heat the support member coated with the developer toner and melt a part of the developer toner to heighten the adhesiveness of developer toner to the support member, or the heating unit in the first embodiment and the infrared heaters in the second embodiment may be used together.

Any other modifications may be made to the embodiment as described above insofar as the modification is not departed from the subject matter of this invention.

What is claimed is:

1. A developer material coating apparatus for coating a developer toner on a support member in a feeding passage to form an uniform, continuous developer toner layer on the support member, comprising:
    developer toner coating means for triboelectrically charging the developer toner and electrostatically coating the charged developer toner on the support member thereby forming a developer layer on the support member; and
    heating means for heating the support member so that the developer toner layer is prevented from falling off from the support member after the support member is coated with the charged developer toner, thereby increasing adhesion between the support member and the developer toner layer.

2. A developer material coating apparatus as claimed in claim 1, wherein said heating means comprises a heating unit for heating the support member after the support member is coated with the developer toner and melting a part of the coated developer toner to increase adhesiveness of the coated developer toner to the support member.

3. A developer material coating apparatus as claimed in claim 2, wherein said heating unit comprises a heater confronting the rear surface of the support member.

4. A developer material coating apparatus as claimed in claim 3, wherein said heating unit further comprises a roller confronting said heater with respect to the support member.

5. A developer material coating apparatus as claimed in claim 2, wherein said heating unit comprises of one a fan heater or an infrared lamp.

6. A developer material coating apparatus as claimed in claim 1, wherein said heating means comprises at least one heater for heating and drying the support member.

7. A developer material coating apparatus as claimed in claim 6, wherein said at least one heater is disposed in the feeding passage.

8. A developer material coating apparatus as claimed in claim 6, wherein said at least one heater comprises an infrared heater.

9. A developer material coating apparatus as claimed in claim 1, wherein said developer toner coating means comprises developer toner charging means for triboelectrically charging the developer toner and developer toner attracting means for electrostatically attracting the charged developer toner.

10. A developer material coating apparatus as claimed in claim 1, wherein the support member comprises plain paper.

11. A developer material coating apparatus, comprising:
    developer toner coating means for triboelectrically charging developer toner and electrostatically coating the charged developer toner on a support member thereby forming an uniform and continuous developer layer on the support member; and
    heating means for heating the support member at least one of before and after the support member is coated with the charged developer toner, thereby increasing adhesion between the support member and the developer toner layer so that said developer toner layer can subsequently develop an image by contact with a microcapsule sheet containing an undeveloped image.

12. An apparatus, comprising:
    exposure means for exposing a microcapsule sheet to imaging light;
    developer toner coating means for triboelectrically charging developer toner and electrostatically coating the charged developer toner on a support member thereby forming a developer layer in a continuous and uniform manner on the support member;
    heating means for heating the support member at least one of before and after the support member is coated with the charged developer toner, thereby increasing adhesion between the support member and the developer toner layer; and
    pressure developing means for pressing the coated support member and the exposed microcapsule sheet together, and forming a visible image on the support member.

* * * * *